(12) United States Patent
Coronel et al.

(10) Patent No.: US 7,749,858 B2
(45) Date of Patent: Jul. 6, 2010

(54) PROCESS FOR PRODUCING AN MOS TRANSISTOR AND CORRESPONDING INTEGRATED CIRCUIT

(75) Inventors: Philippe Coronel, Barraux (FR); Claire Gallon, Grenoble (FR); Claire Fenouillet-Beranger, Grenoble (FR)

(73) Assignees: STMicroelectronics (Crolles 2) SAS, Crolles (FR); Commisssariat a l'Energie Atomique, Paris (FR)

( * ) Notice: Subject to any disclaimer, the term of this patent is extended or adjusted under 35 U.S.C. 154(b) by 30 days.

(21) Appl. No.: 11/487,706

(22) Filed: Jul. 17, 2006

(65) Prior Publication Data

US 2007/0037324 A1 Feb. 15, 2007

(30) Foreign Application Priority Data

Jul. 18, 2005 (FR) .................................... 05 07598

(51) Int. Cl.
*H01L 21/76* (2006.01)
(52) U.S. Cl. ................ 438/424; 438/197; 257/E21.545; 257/E21.546
(58) Field of Classification Search ................ 438/197, 438/424; 257/E21.545, E21.546, E21.553, 257/E21.563, E21.564
See application file for complete search history.

(56) References Cited

U.S. PATENT DOCUMENTS 5,436,174 A 7/1995 Baliga et al.
5,949,126 A * 9/1999 Dawson et al. .............. 257/513
6,633,066 B1 * 10/2003 Bae et al. .................... 257/347
6,924,182 B1 * 8/2005 Xiang et al. ................ 438/197
2003/0003680 A1 * 1/2003 Raineri et al. .............. 438/423
2004/0242015 A1 12/2004 Kim et al.
2006/0148164 A1 * 7/2006 Park ........................... 438/216

FOREIGN PATENT DOCUMENTS

EP 0 845 803 6/1998
EP 1 237 185 9/2002

OTHER PUBLICATIONS

Huda, et al., "Thick elevation of silicon on patterned structure using ion implantation induced selective etching," Nuclear Instruments & Methods in Physics Research, Section B: Beam Interactions with Materials and Atoms, Elsevier, Amsterdam NL, vol. 216, Feb. 2004, ps. 20-24; XP004489473; ISSN: 0168-583X.
Preliminary French Search Report, FR 05 07598, dated May 15, 2006.

* cited by examiner

*Primary Examiner*—Ha Tran T Nguyen
*Assistant Examiner*—Daniel Whalen
(74) *Attorney, Agent, or Firm*—Gardere Wynne Sewell LLP

(57) ABSTRACT

A silicon substrate (SOI) is placed on a buried oxide layer (BOX). An MOS transistor is produced in an active zone of the substrate which is defined by an isolating region. A gate region and source and drain regions, which between them define a channel, are produced so that the gate region extends above the channel. The isolating region is produced by localized formation of a zone of material that can be selectively etched with respect to silicon. That material is selectively etched, and a dielectric material is deposited in the etched feature. The etching is carried out after the gate region has been produced.

17 Claims, 4 Drawing Sheets

PROCESS FOR PRODUCING AN MOS TRANSISTOR AND CORRESPONDING INTEGRATED CIRCUIT

PRIORITY CLAIM

The present application claims priority from French Application for Patent No. 05 07598 filed Jul. 18, 2005, the disclosure of which is hereby incorporated by reference.

BACKGROUND OF THE INVENTION

1. Technical Field of the Invention

The present invention relates to integrated circuits and more particularly to MOS-type transistors.

2. Description of Related Art

The fabrication of transistors produced in MOS technology is faced with several problems, among which to be noted are short-channel effects.

Such is in particular the case in transistors produced on a bulk silicon substrate.

It will be recalled here that a short-channel, that is to say one having a distance (or length) that is very short between the source and the drain of the transistor, leads to a reduction in the threshold voltage of the transistor. This may in the extreme limit lead to a transistor being obtained that is very difficult to control.

Transistors produced in SOI (Silicon On Insulator) technology, in particular in fully-depleted SOI technology, apart from the advantages associated with the formation of a more compact architecture than in a bulk silicon substrate, make it possible to reduce the short-channel effects.

Using this technique, the substrate is made of silicon and is formed on top of a buried oxide (BOX) layer.

Now, in an SOI structure, the thickness of both the silicon film and the buried oxide layer is relatively small. This is because the buried oxide layer is generally between 1450 and 4000 Å. Such is also the case of the SOI film, the thickness of which is generally around 200 Å.

It has been found that the small thickness of the buried oxide layer reduces the electrostatic coupling between the drain region and the source region. This limits the phenomenon of short-channel effects.

During the etching operations carried out when producing the isolation region that defines the active zone, in which the transistor is defined, the buried oxide layer is liable to be etched. This results in an excessive consumption of insulation material for producing the STI (Shallow Trench Isolation) region.

In addition, it has also been found that, when using this technique, the SOI film protrudes on top of the buried oxide layer, so that the gate region is also formed laterally on either side of the SOI region, thereby tending to create parasitic transistors on the SOI sidewalls coated with the gate material.

There is accordingly a need in the art to alleviate the drawbacks of the techniques for fabricating MOS transistors produced in SOI technology.

SUMMARY OF THE INVENTION

In accordance with an embodiment of the invention, a process for producing an MOS transistor on an SOI silicon substrate placed on a buried oxide layer, said transistor being produced in an active substrate zone defined by an isolating region, comprises: defining the isolating region; and producing a gate region and source and drain regions, which between them define a channel so that the gate region extends above the channel.

The isolating region is produced by localized formation of a zone of material that can be selectively etched with respect to silicon, by selectively etching said material and depositing a dielectric material in the etched features.

Furthermore, the etching is carried out after the gate region has been produced.

Thus, by producing the gate by deposition of a gate material on the dielectric or high-permittivity material, it being possible for the latter to be selectively etched with respect to silicon, the silicon can therefore be actively etched after the gate. The silicon etching step, implemented using conventional processes, which is usually carried out at the start of the process and has a tendency to etch the buried oxide layer, is omitted. Furthermore, the gate may be formed on a perfectly planar surface, thereby preventing the formation of parasitic transistors on the SOI sidewalls.

In one way of implementing the process according to the invention, a germanium ion implantation is carried out in the future isolating region, the substrate is annealed so as locally to convert the substrate into a silicon-germanium alloy, a layer of gate material is deposited on the substrate, with interposition of a gate oxide layer, etching of the gate is carried out, then etching is carried out in the silicon-germanium alloy zone, so as to remove said alloy, and said dielectric material is deposited in the etched substrate zone.

Preferably, spacers for the gate are formed before the substrate is etched.

For example, the dielectric deposited is a dielectric of the same type as that of the spacers.

In one example of how the process is implemented, etching is either an isotropic plasma etching step or an isotropic wet etching step.

Etching may be carried out so as to etch the silicon-germanium alloy down to the underlying oxide layer.

According to another embodiment of the invention, an integrated circuit comprises an MOS transistor having a gate region formed on top of an SOI silicon substrate deposited on a buried oxide layer between mutually opposed zones of an isolating region defining an active zone in which the transistor is formed.

According to a general feature of this circuit, the upper surface of the isolating region is flush with the upper portion of the SOI substrate so that the gate region lies on a planar surface.

According to an embodiment, a method comprises: defining an isolating region in a silicon substrate placed on a buried oxide layer, the isolating region being a zone of material surrounding an active region of the silicon substrate, the material capable of being selectively etched with respect to silicon; forming a gate region over at least a portion of the active region; removing the material by etching to create an isolating region cavity after the gate region is formed; and filling the isolating region cavity with an insulating material.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
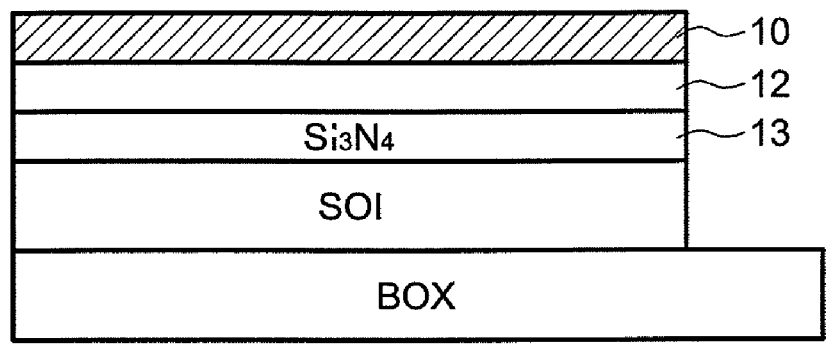
FIG. 1 is a sectional view of a semiconductor device in the course of being produced, showing the formation of the active zone by means of a process according to the prior art.
Figure 2:
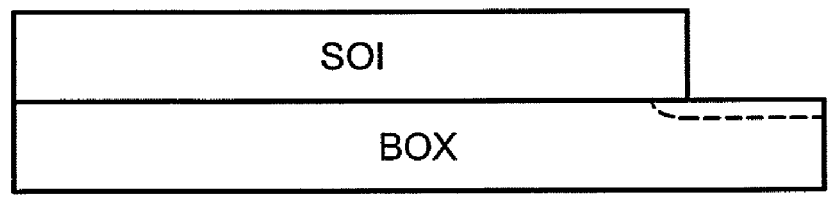
FIG. 2 is another sectional view of a semiconductor device after a cleaning step, before formation of the gate region by means of a process according to the prior art.

FIGS. 1 and 2 show two consecutive phases in the production of a semiconductor device by means of a process according to the prior art.

As shown in these figures, the process comprises producing MOS transistors on a silicon substrate of the SOI type placed on a buried oxide layer (BOX).

According to this type of technology, the buried oxide layer has a thickness of around 1500 Å.

The process step shown in FIG. 1 corresponds to an active photolithography phase prior to deposition of gate material on the SOI substrate.

At this stage, the SOI substrate is covered with a layer of photoresist 10 with interposition of a hard mask 12 and layer 13 of nitride $Si_3N_4$.

Referring to FIG. 2, before the gate material is deposited it is necessary to carry out a cleaning phase. As shown in FIG. 2, this cleaning phase results in a not insignificant etching of the buried oxide layer BOX down to a thickness that may reach 100 or even 150 Å.

As will be understood, it is not possible with this technique to produce transistors on a substrate deposited on a buried oxide layer having a thickness of around 200 Å so as to limit electrical coupling and create field lines between the drain and the source of the transistor through the BOX layer and to avoid standard integration of the isolation region STI.

Furthermore, as FIG. 2 reveals, the gate material is deposited using this technique on a non-planar surface, which, as mentioned above, results in the appearance of lateral parasitic transistors.

A process for producing MOS transistors according to the invention that helps to alleviate these drawbacks will be described with reference to FIGS. 3 to 7.

The process described in these figures comprises producing MOS transistors on a semiconductor SOI substrate placed on a buried oxide layer BOX.

As will be described in detail further on, this process makes it possible to produce transistors on an oxide layer with a thickness of around 200 Å placed on top of a buried oxide layer also having a thickness of around 200 Å, or even 100 Å.

Figure 3:
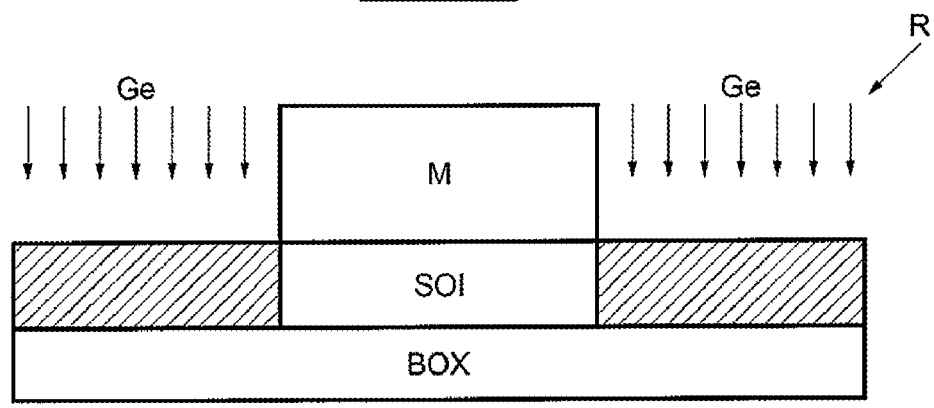
FIG. 3 is a sectional view of a semiconductor device during a first phase of forming an isolation region by means of a process according to the invention.

Referring firstly to FIG. 3, the first phase of the process comprises carrying out a conventional active photolithography step during which a photolithography mask M is deposited in that point of a zone of the substrate which is intended to constitute the active zone in which a transistor will be formed. Such a mask M is formed by depositing a resist appropriate for the intended use, using a technique known per se.

Figure 4:
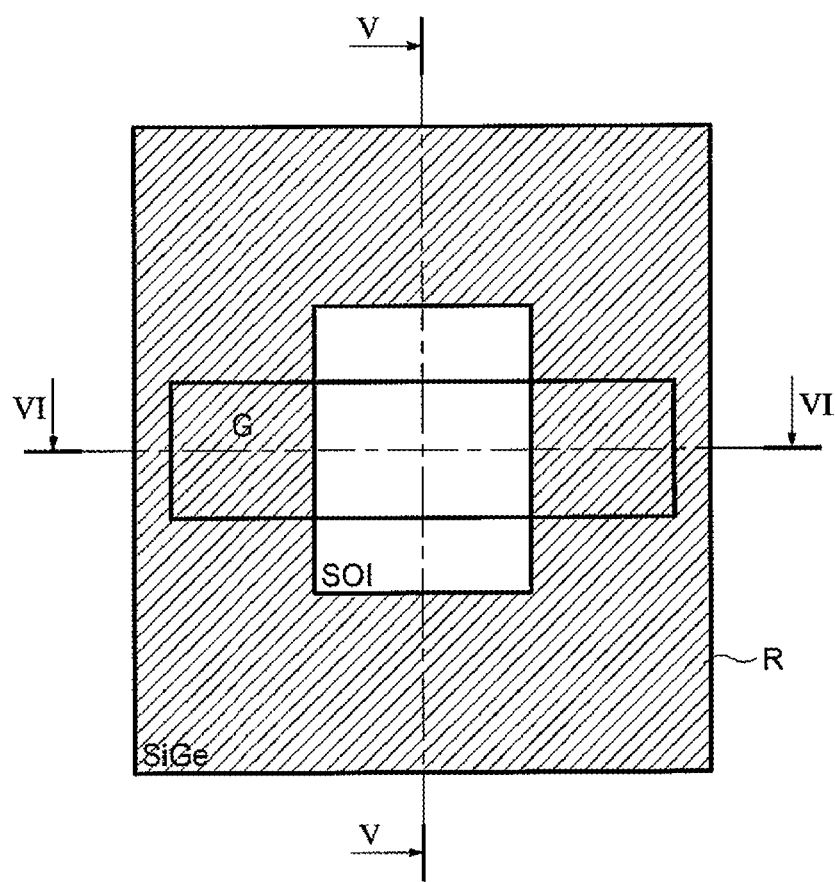
FIG. 4 is a top view of a semiconductor device in the course of being produced by means of a process according to the invention, after conversion of the isolation region into a silicon-germanium alloy and formation of the gate region.

Referring also to FIG. 4, after the mask has been deposited, a germanium ion implantation is carried out in a zone of the substrate located in the isolating region R that defines the active zone.

The resist is removed and the substrate is annealed in order to form, locally, a silicon-germanium alloy in the isolation region R.

Figure 5:
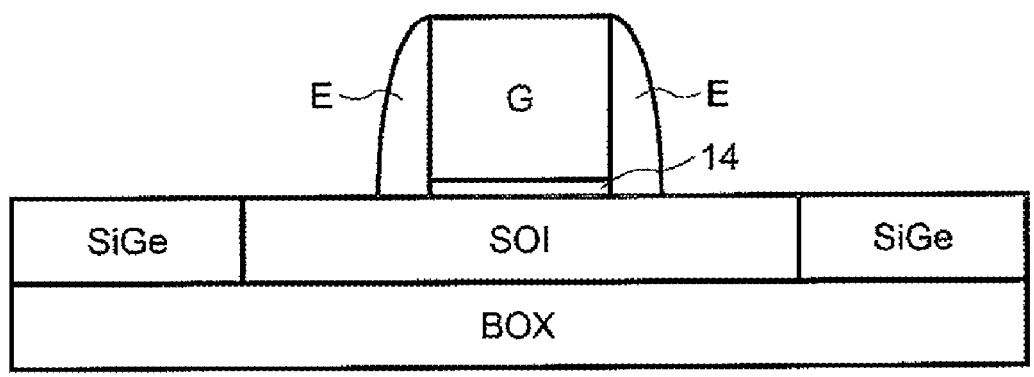
FIG. 5 is a sectional view in along FIG. 4 lines V-V, showing the formation of the spacers.

Referring also to FIG. 5, the gate G is then formed.

This gate formation phase is carried out in a conventional manner and will therefore not be described in detail below.

However, it should be noted that it essentially comprises depositing a gate oxide layer 14 on the SOI substrate and then in depositing a layer of gate material, for example polycrystalline silicon, on the gate oxide layer. A photolithography step followed by an etching step are then carried out, so as to leave behind only a deposit of a gate oxide covered with gate material in the gate region for the transistor to be produced.

Next, spacer material is deposited and then etched, so as to produce the spacers E.

During the following step, that is to say after formation of the gate provided with these spacers E, the silicon-germanium alloy is selectively removed and then, later, a silicidation phase is carried out. Various techniques may be used for the selective removal of this silicon-germanium alloy. For example, it is thus possible to use isotropic plasma or wet etching, it also being possible for chemical etching to be employed for this purpose.

It should be noted that the germanium ion implantation into the region R of the substrate intended to constitute the isolating region was carried out so as subsequently to form a localized zone of a silicon-germanium alloy, which may be selectively etched with respect to the silicon of the SOI substrate. As a variant, it is also possible to carry out a localized implantation of any other material that can be selectively etched with respect to silicon. However, the use of a silicon-germanium alloy is advantageous in so far as the SiGe alloy zone can then be easily formed relatively rapidly by conventional techniques.

Figure 6:
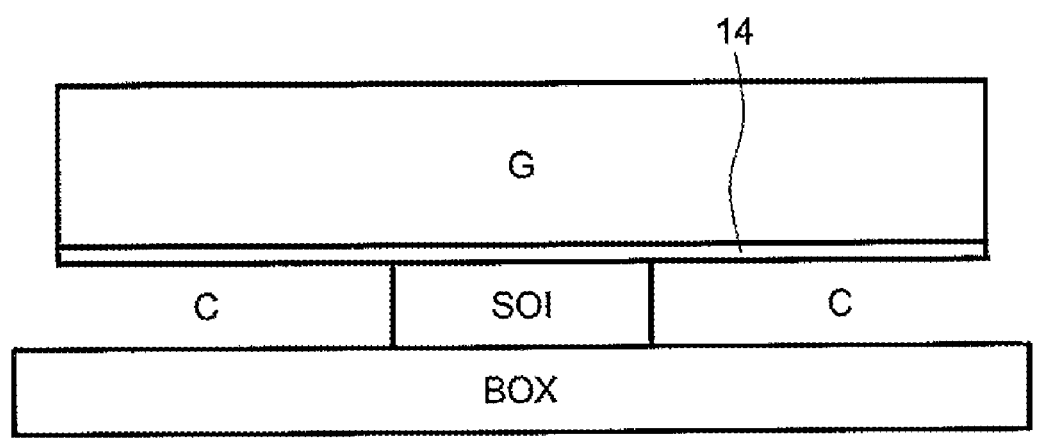
FIG. 6 is a sectional view along FIG. 4 lines VI-VI of the device of FIGS. 3 to 5, after the etching operation.

After this etching phase, the device is in the step shown in FIG. 6, in which a cavity C has been created in the silicon-germanium.

During the next step, a dielectric is deposited in order to fill the cavities created after the etching step.

Figure 7:
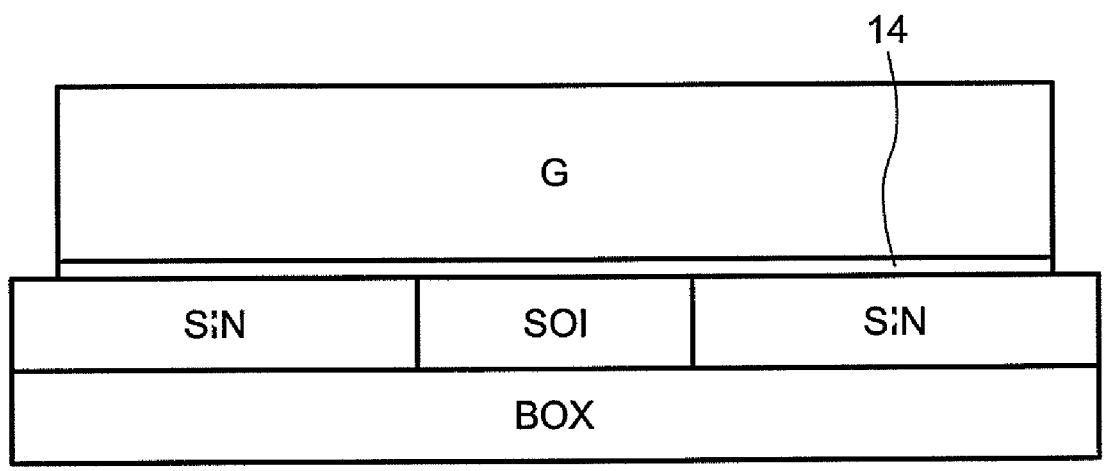
FIG. 7 shows a sectional view along FIG 4 lines VI-VI of the device of FIG. 6 after the filling of the cavity formed after etching.

A dielectric is then deposited, as shown with reference to FIG. 7. For example, this dielectric may be of the same type as that used for forming the spacers E, so that the spacers may also be formed during this step. For example, the dielectric filling the cavity C consists of silicon nitride. Various techniques may be used to carry out this step. Thus, for example, it is possible to deposit dielectric using a chemical vapor deposition (CVD) or low pressure chemical vapor deposition (LPCVD) technique. The integrated circuit visible in FIG. 7, in which the cavities are filled with nitride (SiN), is then obtained.

As may be seen in this figure, the upper face of the isolation region R is flush with the upper face of the SOI substrate.

Finally, as is conventional in SOI, the source and drain regions then have to be formed by conventional photolithography, ion implantation and silicidation techniques, and then the whole assembly has to be covered with a PMD (Pre-Metal Dielectric) layer.

Thanks to the process that has just been described, it was thus possible to produce a gate region on an SOI substrate deposited on a relatively thin buried oxide layer BOX, that is to say with a thickness of around 200 Å, in so far as no process step results in the oxide layer BOX being etched. Furthermore, the gate lies on a perfectly planar surface, thus preventing the creation of lateral parasitic transistors.

In addition, the process according to the invention makes it possible to obtain the following advantages:

thanks to the invention, it is unnecessary to provide a step of forming an STI module in order to produce the isolation region;

the actual isolation region may be formed after formation of the gate;

the process, and in particular the deposition of dielectric, may be carried out at low temperature, and adaptable to various technologies;

the process makes it possible to strain the transistor channel by deposition, for example, of tensile or compressive silicon nitride SiN in the isolation region; and the benefit of having SiGe makes it possible, inter alia, to have a single-crystal material for growth of the gate oxide and to reduce the problems of oxide reliability compared for example with a material of the $Si_3N_4$ type.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for producing an MOS transistor on a silicon substrate placed on a buried oxide layer, said transistor being produced in an active substrate zone defined by an isolating region, the process comprising:

defining the isolating region;

producing a MOS transistor gate and MOS transistor source and drain regions, wherein between the source and drain regions there is a channel that the MOS transistor gate extends above, wherein the isolating region is defined by localized formation of a zone of material that can be selectively etched with respect to silicon, localized formation comprising:

performing a germanium ion implantation in the isolating region;

annealing the substrate so as to locally convert silicon into a silicon-germanium alloy; and selectively etching said zone of material to form an etched feature and depositing a dielectric material in the etched feature, wherein selectively etching is carried out after the MOS transistor gate has been produced.

2. The process according to claim 1, wherein the MOS transistor gate is deposited on the substrate, with interposition of a gate oxide layer, etching is carried out in the silicon-germanium alloy after deposit of the MOS transistor gate so as to remove said silicon-germanium alloy, and said dielectric material is deposited in said etched feature.

3. The process according to claim 2, wherein spacers around the MOS transistor gate are formed before the silicon-germanium is etched.

4. The process according to claim 3, wherein the dielectric deposited is a dielectric of the same type as that of the spacers.

5. The process according to claim 4, wherein the dielectric is silicon nitride.

6. The process according to claim 2, wherein etching is either an isotropic plasma etching or an isotropic wet etching.

7. The process according to claim 2, wherein etching is carried out so as to etch the silicon-germanium alloy down to an underlying buried oxide layer.

8. A method for producing an MOS transistor, comprising:

defining an isolating region in a silicon substrate placed on a buried oxide layer, the isolating region being a zone of material surrounding an active region of the silicon substrate, the zone of material capable of being selectively etched with respect to silicon, wherein the material capable of being selectively etched with respect to silicon is a silicon-germanium alloy;

forming a MOS transistor gate over at least a portion of the active region;

removing the zone of material by etching to create an isolating region cavity after the MOS transistor gate is formed; and filling the isolating region cavity with an insulating material, wherein defining the isolating region comprises implanting germanium ions in the isolating region and annealing so as to locally convert silicon in the isolating region into the silicon-germanium alloy.

9. The method of claim 8 wherein forming comprises forming the MOS transistor gate over at least the portion of the active region and at least a portion of the zone of material for the isolating region.

10. The method of claim 8 wherein filling comprises filling with a dielectric material.

11. The method of claim 8 further comprising: producing source and drain regions in the active region of the silicon substrate which therebetween defines a channel in the active region of the silicon substrate above which the MOS transistor gate is located.

12. The method of claim 8, wherein removing comprises etching so as to remove the zone of material down to an underlying buried oxide layer.

13. The method of claim 8, wherein the silicon substrate is SOI.

14. A process for producing an MOS transistor, comprising:

locally forming a zone of sacrificial material that can be selectively etched with respect to silicon and which surrounds an active substrate zone, wherein the sacrificial material comprises a silicon-germanium alloy and wherein locally forming comprises:

performing a germanium ion implantation in an isolating region defined in a silicon substrate;

annealing the silicon substrate so as to locally convert silicon into the silicon-germanium alloy;

producing a MOS transistor gate over the active substrate zone;

selectively etching said zone of sacrificial material after production of the MOS transistor gate to form an etched feature;

depositing a dielectric material in the etched feature; and forming source and drain regions within the active substrate zone with a channel, between the source and drain regions, extending underneath the MOS transistor gate.

15. The process according to claim 14, further comprising forming spacers for the MOS transistor gate before the zone of sacrificial material is selectively etched.

16. The process according to claim 15, wherein the dielectric deposited is a dielectric of the same type as that of the spacers.

17. The process according to claim 14, further comprising forming a buried oxide layer underlying the zone of sacrificial material, and wherein selectively etching comprises etching the sacrificial material down to the underlying buried oxide layer.

* * * * *